(12) United States Patent
Yu

(10) Patent No.: US 7,887,342 B1
(45) Date of Patent: Feb. 15, 2011

(54) STRUCTURE HAVING AN USB MEMORY MODULE

(75) Inventor: Hong-Chi Yu, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 0 days.

(21) Appl. No.: 12/656,215

(22) Filed: Jan. 21, 2010

(30) Foreign Application Priority Data

Dec. 8, 2009 (TW) ................................ 98141943 A

(51) Int. Cl.
*H01R 13/44* (2006.01)
(52) U.S. Cl. ...................... 439/131; 439/76.1; 361/752; 361/737
(58) Field of Classification Search ................ 439/76.1, 439/135, 620.01; 361/752, 735
See application file for complete search history.

(56) References Cited

U.S. PATENT DOCUMENTS

| | | | |
|---|---|---|---|
| 6,743,030 B2 * | 6/2004 | Lin et al. .................... | 439/131 |
| 6,763,410 B2 * | 7/2004 | Yu .............................. | 710/74 |
| 6,808,400 B2 * | 10/2004 | Tu .............................. | 439/131 |
| 7,303,411 B1 * | 12/2007 | Morganstern et al. ........ | 439/131 |
| 7,628,622 B2 * | 12/2009 | Yu et al. ..................... | 439/131 |
| 7,632,113 B2 * | 12/2009 | Finn ........................... | 439/131 |
| 7,674,120 B2 * | 3/2010 | Morganstern et al. ........ | 439/131 |
| 7,771,215 B1 * | 8/2010 | Ni et al. ...................... | 439/131 |
| 7,778,037 B2 * | 8/2010 | Huang ......................... | 361/752 |
| 2006/0023433 A1 * | 2/2006 | Lin ............................. | 361/752 |
| 2007/0042620 A1 * | 2/2007 | Lapstun et al. .............. | 439/157 |
| 2007/0171620 A1 * | 7/2007 | Lee ............................. | 361/737 |
| 2008/0156871 A1 * | 7/2008 | Fidalgo et al. .............. | 235/382 |
| 2008/0252621 A1 * | 10/2008 | Shipton ....................... | 345/179 |
| 2009/0275224 A1 * | 11/2009 | Ni et al. ....................... | 439/131 |

* cited by examiner

*Primary Examiner*—Briggitte R Hammond
(74) *Attorney, Agent, or Firm*—Bacon & Thomas, PLLC

(57) ABSTRACT

A structure having an USB memory module has a housing and a storage device. The housing is hollow and has a chamber defined therein. The memory module of the data storage device is partially received in the chamber of the housing and partially exposed beyond the housing.

17 Claims, 16 Drawing Sheets

STRUCTURE HAVING AN USB MEMORY MODULE

FIELD OF THE INVENTION

The present invention is related to a structure having an USB memory module, and more particularly to a data storage device partially exposed beyond the housing of a memory module.

BACKGROUND OF THE INVENTION

Keeping abreast with the development of electronic industry, various data transmission interfaces, such as Universal Serial Bus (USB), External Serial ATA, e-SATA and the like, appear to the market one after another and are the common data transmission interfaces currently. Besides, because the storage capacity of Non-Volatile Memory (NVM) is significantly upgraded while the size thereof is reduced, portable data storage devices formed by combining data transmission interfaces and NVM have been commonplace recently, thereby further facilitating access and transmission of digital information of people. Above all, the use of flash drive is the most popular product among all. Although digitalization surely delivers more convenient life styles to all walks of life, it also adds more and more carry-on items in daily life of people inevitably. As a result, more lost belongings and difficult storage are followed next.

With reference to FIG. 1, a flash drive taking the form of a pen and disclosed by Taiwanese Patent Publication No. M248624 combines a pen housing (1), an USB connector (2) and a memory device (3) for users to carry so as to reduce the chance of lost belongings and tackle difficult storage. However, due to the standardized specifications of the USB connector (2) and the size of the memory device (3), the outer diameter of the pen housing (1) becomes oversized if the USB connector (2) and the memory device (3) are received therein. Thus, the oversize pen housing (1) makes writing with the pen inconvenient and fails to comply with the call for products being light, thin and short. Therefore, under the premise of less lost belongings and easier storage, how to maintain existing performance and size of conventional products and avail to mount data storage device is certainly a critical subject.

SUMMARY OF THE INVENTION

An objective of the present invention is to provide a structure having an USB memory module, ensuring to additionally mount a data storage module and have data storage function without increasing the outer diameter of the product and thus making the present invention multi-functional.

To achieve the foregoing objective with the following technical measures, the structure having an USB memory module has a housing and a data storage device.

The housing is hollow and has a chamber therein. The data storage device has a foldable connection plug and a memory module. The foldable connection plug has a support seat, a first foldable part and a second foldable part. The support seat has a front end. The first foldable part has a rear end mounted on the front end of the support seat and a plurality of first metal contacts. The second foldable part has a plurality of second metal contacts. The memory module has a substrate and at least one electronic component. The substrate has an inside surface and an outside surface. The at least one electronic component is mounted on the inside surface. The plurality of third metal contacts are mounted on the outside surface. The substrate is electrically connected with the at least one electronic component and the plurality of third metal contacts. The plurality of first metal contacts of the first foldable part and the plurality of second metal contacts of the second foldable part are electrically connected with the plurality of third metal contacts through a plurality of conductors. The memory module is partially received in the chamber of the housing and partially exposed beyond the housing.

Preferably, the foldable connection plug is received in the chamber of the housing.

Preferably, the first foldable part and the second foldable part of the foldable connection plug are exposed beyond the housing, a tubular element is combined with the housing to receive the first foldable part and the second foldable part therein.

Preferably, a pen having a refill is mounted to a lower end of the tubular element.

Preferably, the housing has an outer periphery, and an attaching element is mounted on the outer periphery.

Preferably, the attaching element has an accommodation portion for mounting a pressing element, and the pressing element has an actuation plate, a pressing part and an elastic member. The pressing part is mounted on an outer surface at the end of the actuation plate. The elastic member is mounted on an inner surface at one end of the actuation plate. The pressing part and the elastic member are correspondingly mounted.

Preferably, the pressing part is partially exposed beyond the attaching element.

Preferably, a groove is formed in a rear end of the accommodation portion to cover the memory module exposed beyond the housing.

Preferably, the first foldable part has a first slot on a side surface thereof, and the second foldable part has a second slot on a side surface thereof, the first slot and the second slot are adjacently mounted, an opening is formed through an inner surface of the housing corresponding to the first slot and the second slot so that an end portion of the actuation plate penetrates through the opening to urge against the first slot and the second slot.

Preferably, the conductors are mounted on a load board, and the load board is securely mounted on a lower surface of the first foldable part and the support seat.

Preferably, the conductors pertain to one type selected from a group consisting of wire, metal bump and metal sheet, or a selective combination of wire, metal bump and metal sheet.

Preferably, the first metal contacts of the first foldable part and the second metal contacts of the second foldable part are compatible with at least one digital data transmission specification of the USB, Mini USB, Micro USB and e-SATA transmission interfaces.

Preferably, the first foldable part and the support seat are integrally formed.

Preferably, the housing has a stopper mounted therein, and the stopper abuts the memory module.

Preferably, at least one elastic element is mounted between the stopper and the support seat.

Preferably, each of the at least one electronic component comprises at least one control unit, at least one passive element, and at least one memory chip.

Another objective of the present invention is to provide a structure having an USB memory module and solve technical issue thereof with the following technical measure, a structure having an USB memory module, a housing and a data storage device.

The housing is hollow and has a chamber formed therein. The data storage device has a connection plug and a memory module. The connection plug is received in the chamber of the housing and has a support seat and a plurality of metal contacts. The support seat has a front end and a rear end. The front end is mounted to a rear end of the connection plug. The memory module has a front end, a substrate, and at least one electronic component. The front end is mounted to the rear end of the support seat. The substrate has an inside surface and an outside surface. The at least one electronic component is mounted on the inside surface. The substrate is electrically connected with the at least one electronic component and the plurality of metal contacts of the connection plug. The memory module is partially received in the chamber of the housing and partially exposed beyond the housing.

Preferably, the housing has an outer periphery, an attaching element is mounted on the outer periphery, the attaching element has an accommodation portion for mounting a pressing element, the pressing element has an actuation plate, an elastic member and a pressing part. The elastic member is mounted on an inner surface at one end of the actuation plate. The pressing part is mounted on an outer surface at the end of the actuation plate to correspond to the elastic member.

Preferably, the pressing part is partially exposed beyond the attaching element.

Preferably, the memory module is partially exposed beyond the housing through a through slot of the housing, and the through slot extends toward two ends of the housing, a groove is formed on a rear side of the accommodation portion to correspond to the through slot and cover the memory module exposed beyond the housing.

Preferably, the connection plug has a third slot formed on a side surface thereof, an opening is formed through an inner surface of the housing corresponding to the third slot so that an end portion of the actuation plate penetrates through the opening to urge against the third slot.

Preferably, the plurality of the metal contacts of the connection plug are compatible with at least one digital data transmission specification of USB, Mini USB, Micro USB and e-SATA transmission interfaces.

Preferably, the connection plug and the support seat are integrally formed.

Preferably, a stopper is mounted inside the housing, and the stopper abuts the memory module.

Preferably, at least one elastic element is mounted between the stopper and the support seat.

Preferably, each of the at least one electronic component comprises at least one control unit, at least one passive component, and at least one memory chip.

Preferably, the housing is a pen-shaped housing, and a refill is mounted in a lower end of the pen-shaped housing.

Preferably, the housing is a pen-shaped housing, and a refill is mounted in a lower end of the pen-shaped housing.

Preferably, the pen-shaped housing is a combination of multiple portions detachably connected.

Preferably, the attaching element is a pen clip.

Preferably, the pen-shaped housing has a maximal outer diameter no greater than 12 mm.

In contrast to conventional technique, the present invention redesigns the combined structure of the memory module to additionally mount the data storage device without increasing the outer diameter of the product. Therefore, the product maintains existing function and size and also has data storage function to make the present invention multi-functional.

DETAILED DESCRIPTION OF THE PREFERRED EMBODIMENT

Figure 1:
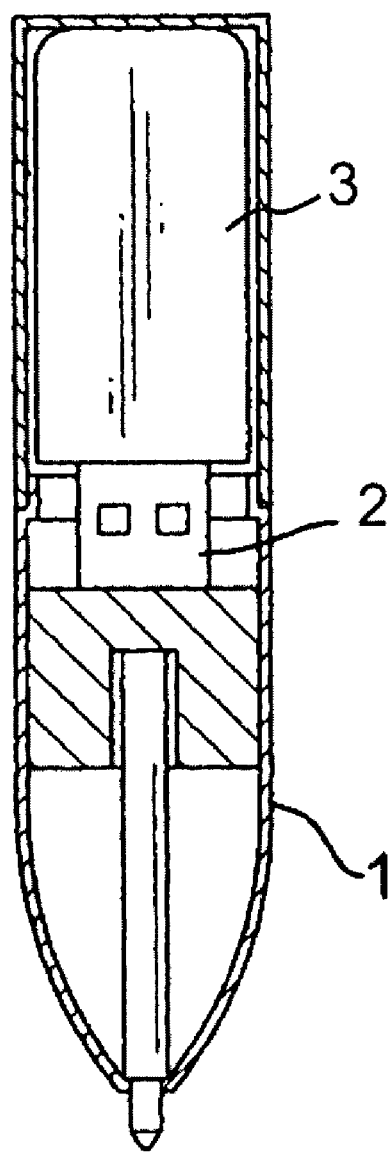
FIG. 1 is a cross-sectional view of a conventional pen having an USB memory device therein.

The foregoing and other features and advantages of the present invention will be more clearly understood through the following preferred embodiments with reference to the drawing.

Figure 2:
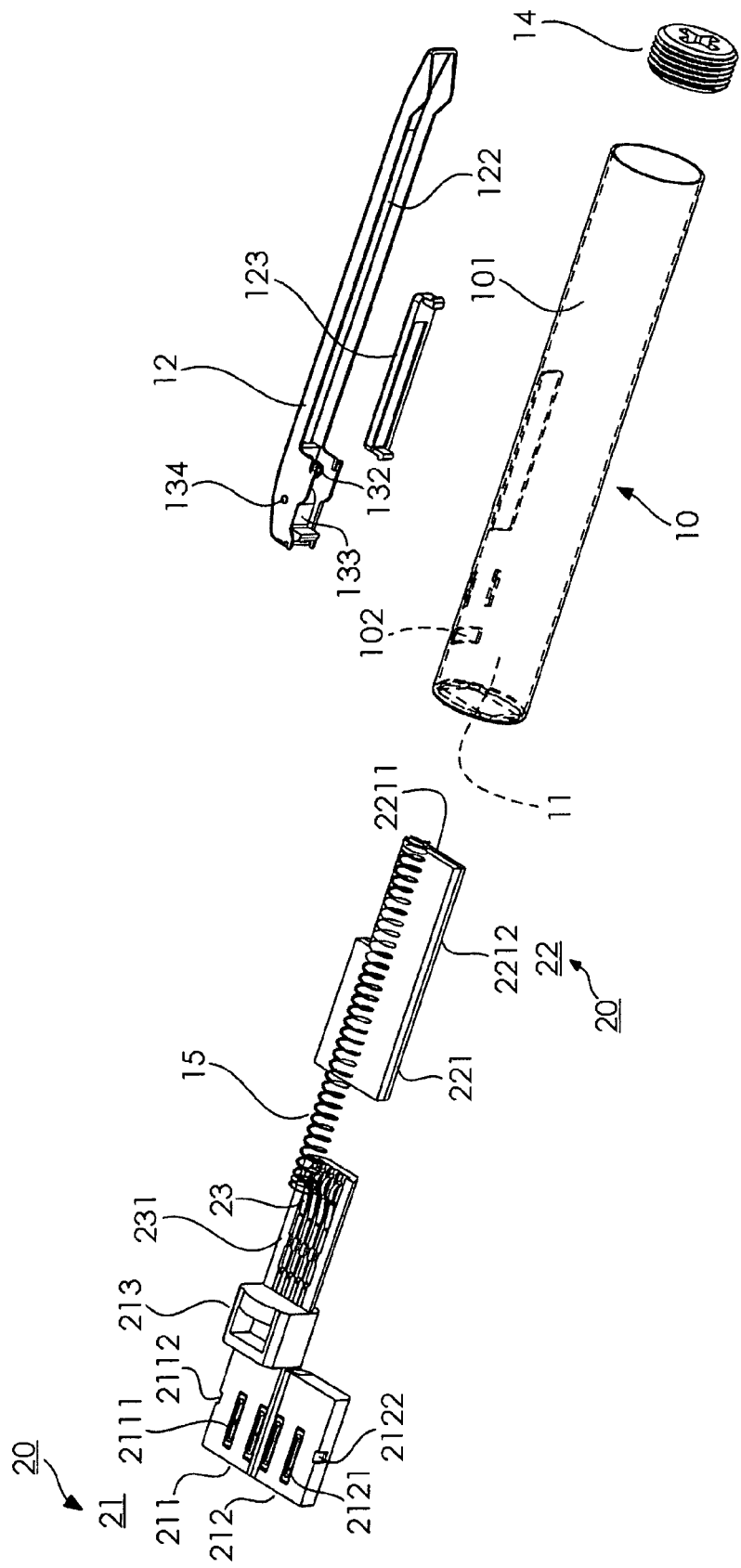
FIG. 2 is an exploded view of a first embodiment of a structure having an USB memory module in accordance with the present invention.
Figure 3:
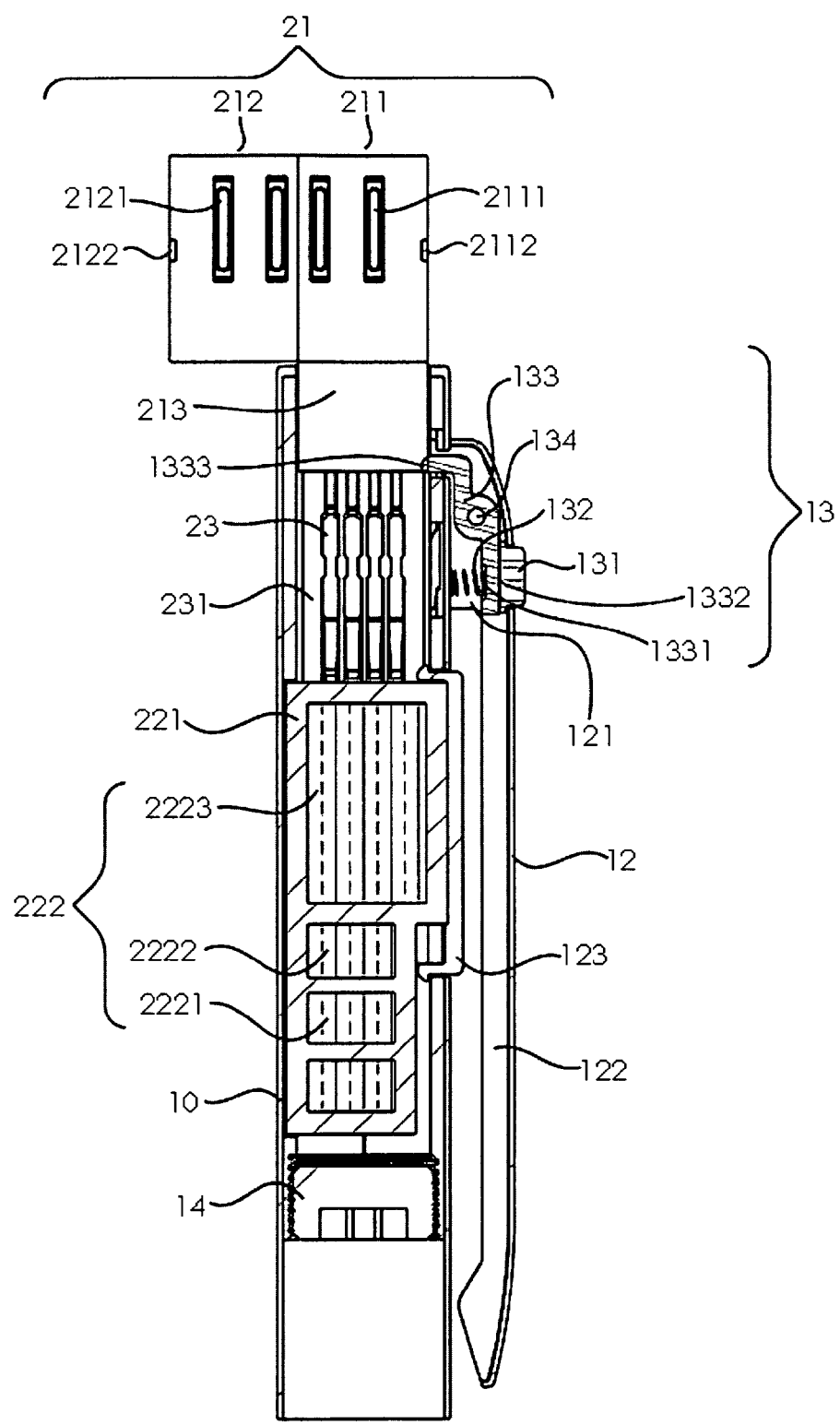
FIG. 3 is a cross-sectional view of the first embodiment of the structure having an USB memory module in accordance with the present invention.
Figure 4:
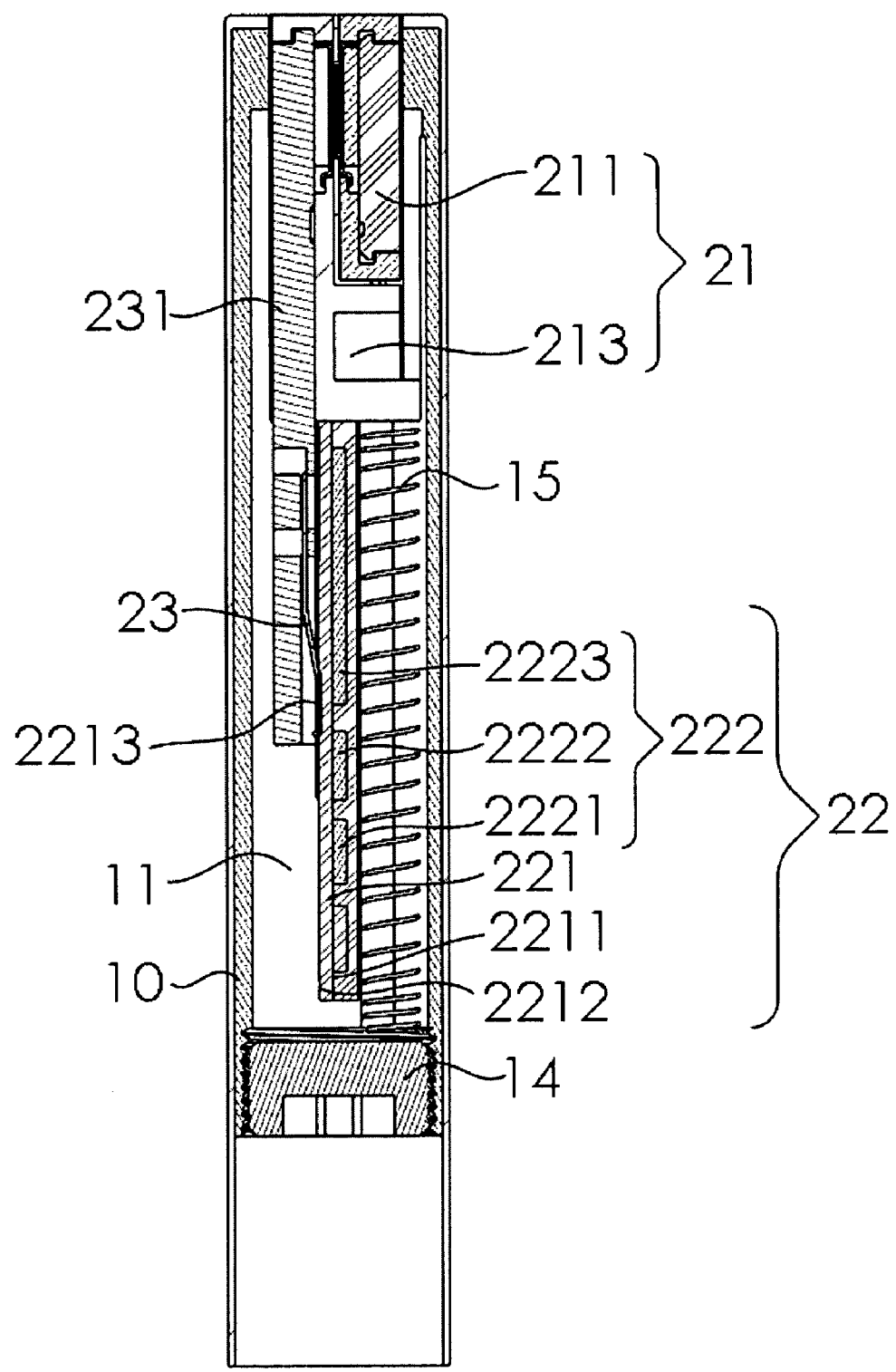
FIG. 4 is another cross-sectional view of the first embodiment of the structure having an USB memory module in accordance with the present invention.

With reference to FIGS. 2 and 3, a first preferred embodiment of a structure having an USB memory module in accordance with the present invention has a housing (10) and a data storage device (20). The housing (10) is hollow and has a chamber (11) defined therein. Preferably, an attaching element (12) is mounted on an outer periphery (101) of the housing (10) and has an accommodation portion (121) for mounting a pressing element (13). The pressing element (13) has a pressing part (131), an elastic member (132) and an actuation plate (133). The elastic member (132) is mounted on an inner surface (1331) of an outer surface at one end of the actuation plate (133). The pressing part (131) is mounted on an outer surface (1332) at the end of the actuation plate (133). The pressing part (131) and the elastic member (132) are correspondingly mounted. Preferably, the elastic member (132) may be a compression spring. Besides, the pressing part (131) is partially exposed beyond the attaching element (12). The data storage device (20) has a foldable connection plug (21) and a memory module (22). The foldable connection plug (21) is received in the chamber of the housing (10) as shown in FIG. 4 and has a first foldable part (211), a second foldable part (212) and a support seat (213). A rear end of the first foldable part (211) is mounted on a front end of the support seat (213). The first foldable part (211) and the second foldable part (212) respectively have a plurality of metal contacts (2111) (2121). Preferably, these metal contacts (2111) (2121) may be compatible with at least one digital data transmission specification of the USB, Mini USB, Micro USB and e-SATA transmission interfaces. Moreover, the memory module (22) may be partially received in the chamber (11) of the housing (10) and partially exposed beyond the housing (10). Preferably, a groove (122) is formed in a rear end of the accommodation portion (121) to cover the memory module (22) exposed beyond the housing (10). Preferably, a lid (123) is mounted on an outer periphery (101) of the housing (10) so that the lid (123) fully covers the memory module (22) exposed beyond the housing (10).

With reference to FIG. 4, the memory module (22) has a substrate (221) and at least one electronic component (222). The substrate (221) has an inside surface (2211) and an outside surface (2212). The at least one electronic component (222) is mounted on the inside surface (2211). A plurality of the metal contacts (2213) are mounted on the outside surface (2212). Each of the at least one electronic component (222) has at least one control unit (2221), at least one passive element (2222) and at least one memory chip (2223). Preferably, the substrate (221) may be a high-density multilayer printed circuit board having conducting vias and circuits (not shown) formed therein and electrically connected (not shown) with the at least one electronic component (222) and the metal contacts (2213) on the substrate (221).

Figure 5:
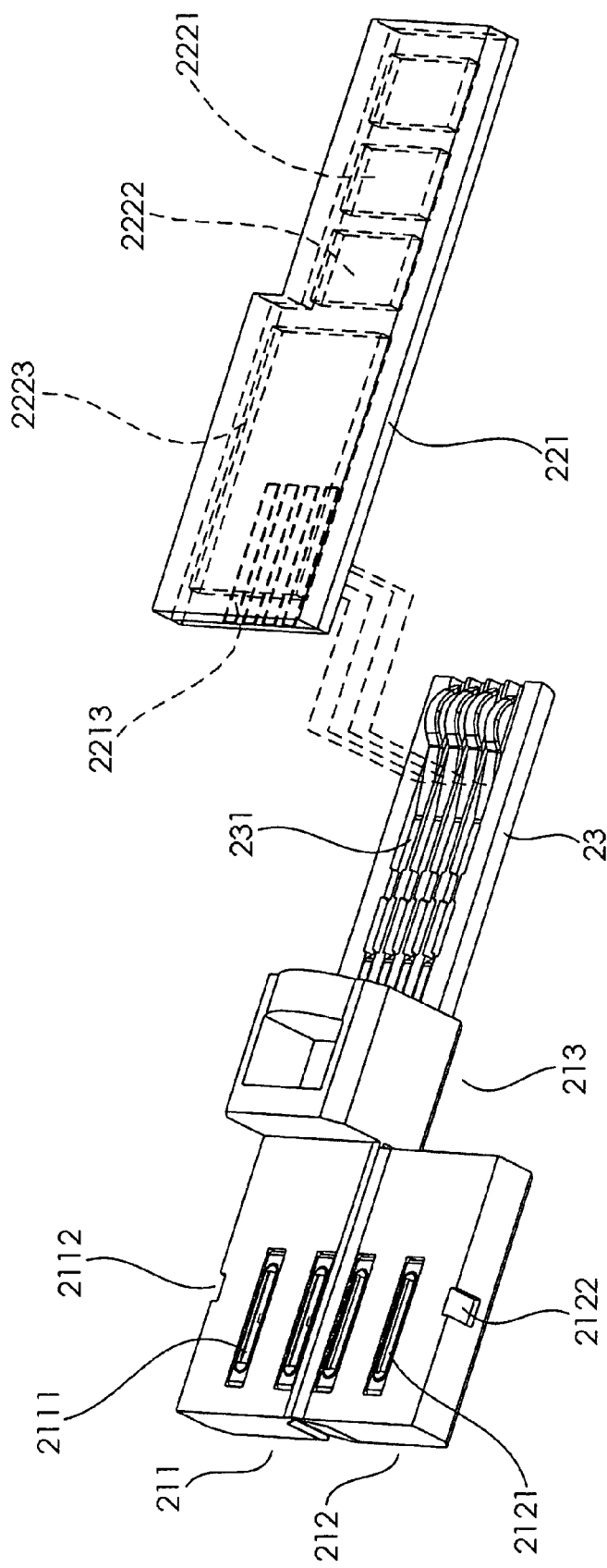
FIG. 5 is a perspective view of metal contacts of a first foldable part and a second foldable part of the first preferred embodiment electrically connected with metal contacts of a memory module through a plurality of conductors in accordance with the present invention.

With reference to FIG. 5, the metal contacts (2111) (2121) of the first foldable part (211) and the second foldable part (212) are electrically connected with the plurality of metal contacts (2213) of the substrate (221) through a plurality of conductors (23). Preferably, with further reference to FIG. 4, those conductors (23) may be mounted on a load board (231), and the load board (231) may be securely mounted on a lower surface of the first foldable part (211) and the support seat (213). The conductors (23) may be at least one of wire, metal bump and metal sheet or any combination thereof.

Besides, the first foldable part (211) and the support seat (213) may be integrally or detachably formed, and is integrally formed in the first preferred embodiment.

Figure 6:
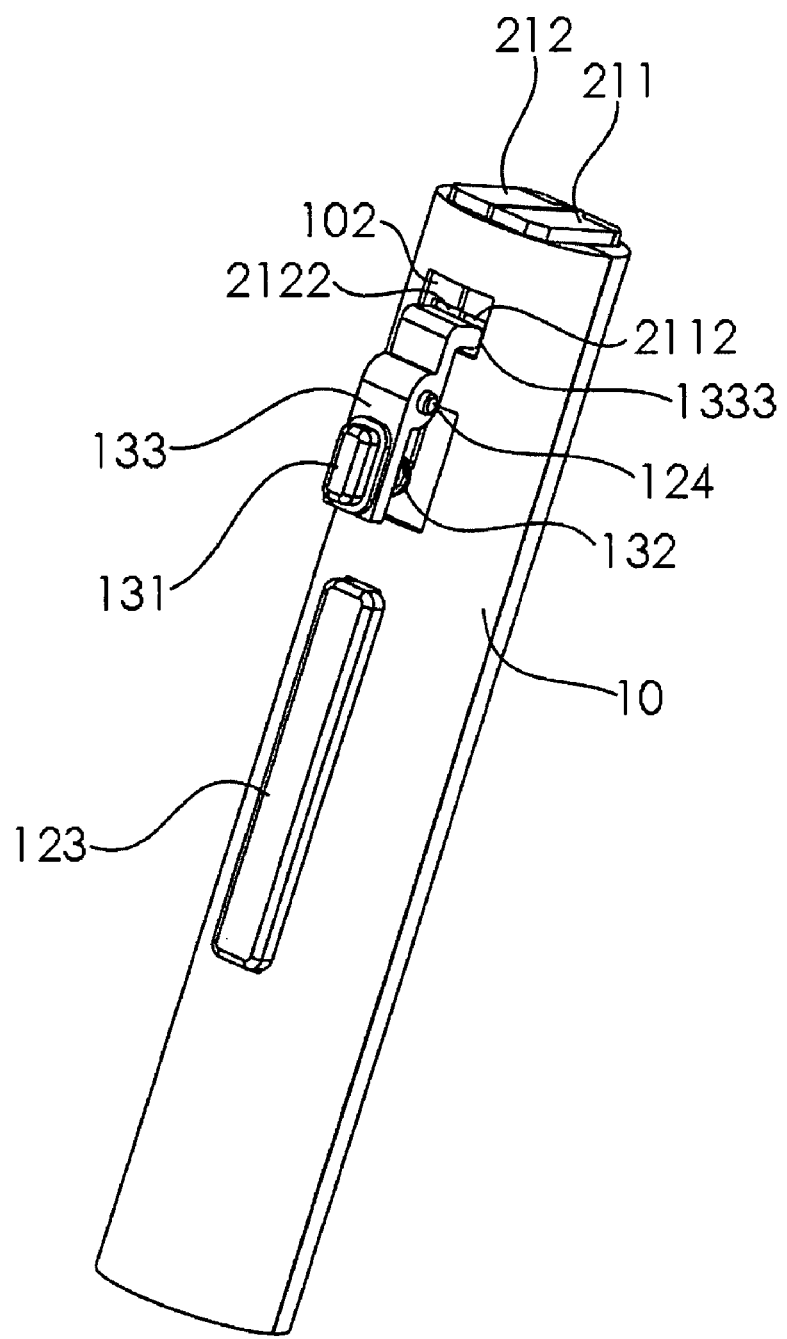
FIG. 6 is a perspective view of a connection plug and a pressing component of the first preferred embodiment in accordance with the present invention.

With reference to FIGS. 3 and 6, the first foldable part (211) has a first slot (2112) on a side surface thereof, and the second foldable part (212) has a second slot (2122) on a side surface thereof. The first slot (2112) and the second slot (2122) are adjacently mounted. An opening (102) is formed through an inner surface of the housing (10) corresponding to the first slot (2112) and the second slot (2122) so that an end portion (1333) of the actuation plate (133) penetrates through the opening (102) to urge against the first slot (2112) and the second slot (2122). With reference to FIG. 4, a stopper (14) is mounted inside the housing (10) and abuts the memory module (22). At least one elastic element (15) is mounted between the stopper (14) and the support seat (213). Preferably, each of the at least one elastic element (15) may be a compression spring. Therefore, when the foldable connection plug (21) is received in the chamber (11) of the housing (10) and the pressing part (131) is exerted by a force, the elastic member (132) is compressed at the same time. Preferably, a stationary point (134) is formed inside the actuation plate (133). When the pressing part (131) is subjected to a force and the elastic member (132) is compressed, the end portion (1333) of the actuation plate (133) is disengaged with the first slot (2112) and the second slot (2122). Meanwhile, the elastic element (15) between the support seat (213) and the stopper (14) releases a pre-pressure to eject the first foldable part (211) and the second foldable part (212) out of the chamber (11). The second foldable part (212) is unfolded so that the second foldable part (212) and the first foldable part (211) are coplanar, making them ready to be electrically connected with electronic devices (not shown) having data transmission interfaces for data transmission. Moreover, the housing (10) may take different form or become accessory of other merchandises, such as pens, business card holders, key chains, pencil cases, lighting devices or the like.

Figure 7:
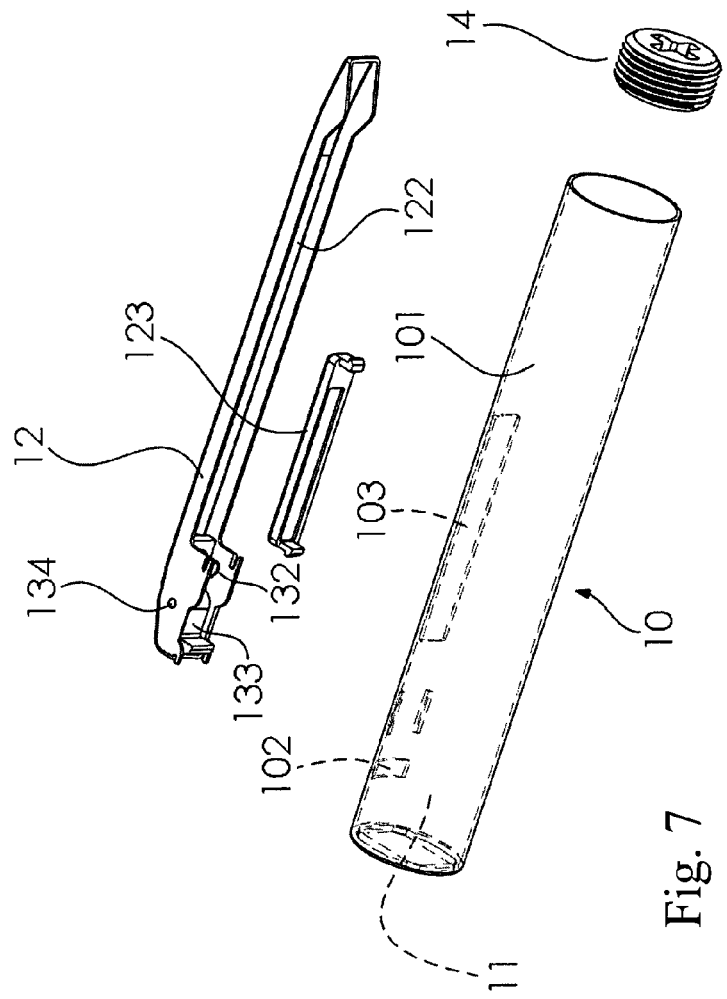
FIG. 7 is an exploded view of a second preferred embodiment of a structure having memory module in accordance with the present invention.
Figure 7:
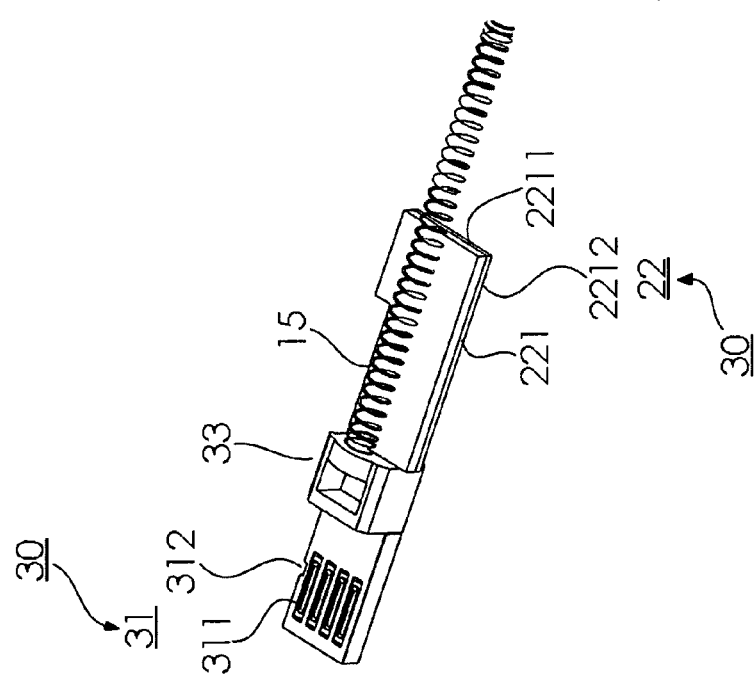
Figure 8:
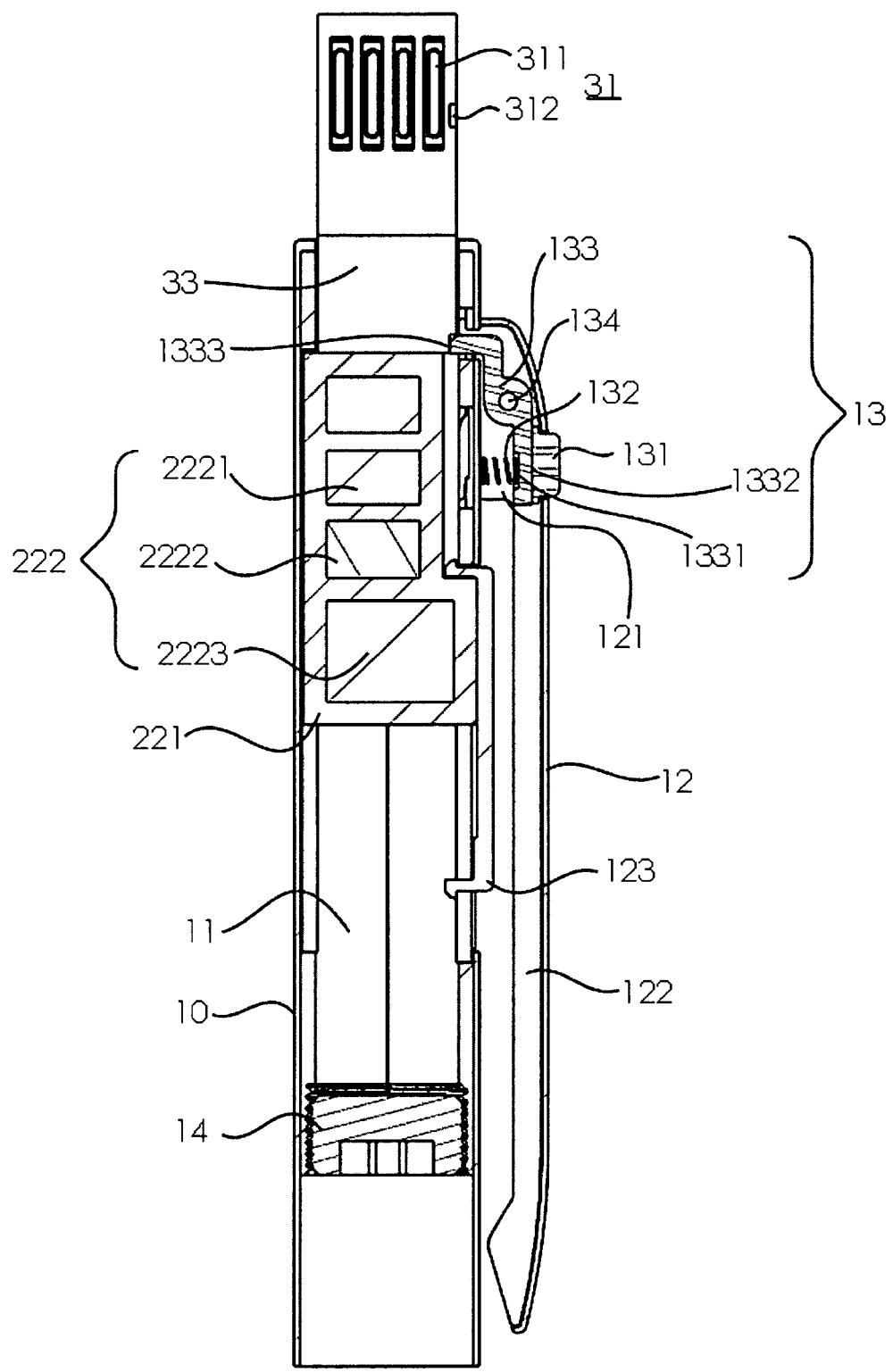
FIG. 8 is a cross-sectional view of the second preferred embodiment of the structure having memory module in accordance with the present invention.

With reference to FIGS. 7 and 8, a second embodiment of a structure having a USB memory module in accordance with the present invention is illustrated. Similar parts of the first embodiment illustrated in FIGS. 2 to 6 are marked with same reference numerals in FIGS. 7 and 8 and are not repeated hereafter.

Figure 9:
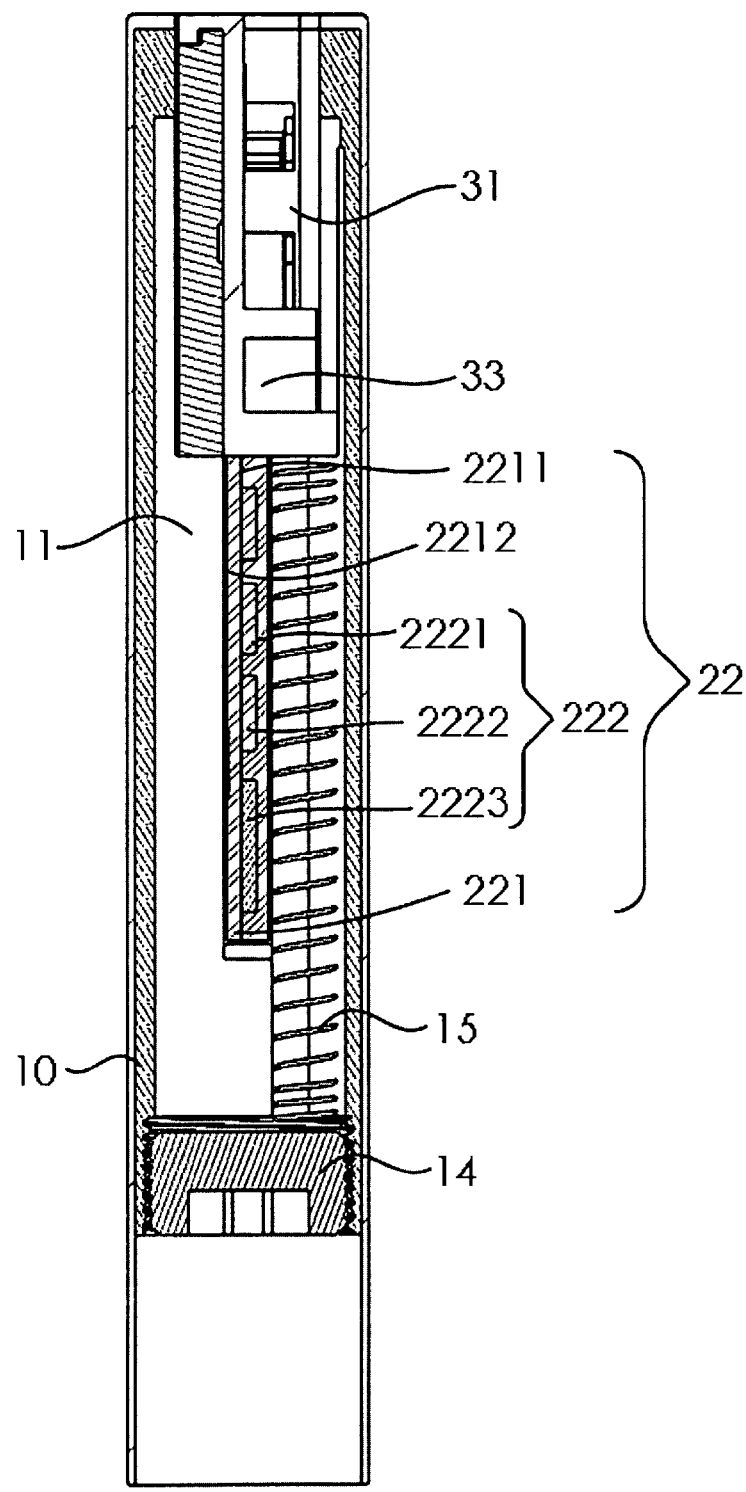
FIG. 9 is another cross-sectional view of the second preferred embodiment of the structure having memory module in accordance with the present invention.

The second embodiment differs from the first embodiment in a data storage device (30) having a first memory module (22) and a connection plug (31). The connection plug (31) replaces the foldable connection plug (21) in the first embodiment. The connection plug (31) is received in a chamber (11) of a housing (10) as shown in FIG. 9, and its rear end is securely mounted to a front end of a support seat (33). The rear end of the support seat (33) is mounted to a front end of the memory module (22). Preferably, the connection plug (31) and the support seat (33) may be integrally formed. Besides, the connection plug (31) has a plurality of metal contacts (311). Preferably, these metal contacts (311) may be compatible with at least one digital data transmission specification of the USB, Mini USB, Micro USB and e-SATA transmission interfaces. The memory module (22) may be partially received in the chamber (11) of the housing (10), and partially exposed beyond the housing through a through slot (103) of the housing (10), and the through slot (103) extends toward two ends of the housing (10). Preferably, a groove (122) on a rear side of an accommodation portion (121) of an attaching element (12) corresponds to the through slot (103) and can cover the memory module (22) exposed beyond the housing (10). With reference to FIG. 9, the memory module (22) has a substrate (221) and at least one electronic component (222). The substrate (221) has an inside surface (2211) and an outside surface (2212). The at least one electronic component (222) is mounted on the inside surface (2211). The substrate (221) is electrically connected with the metal contacts (311) of the at least one electronic component (222) and the connection plug (31). Since electrical connection pertains to common sense, in addition to using a conductor (23) as described in the first embodiment for electrical connection, other means may be adopted as well but there is no need to go into details.

Figure 10:
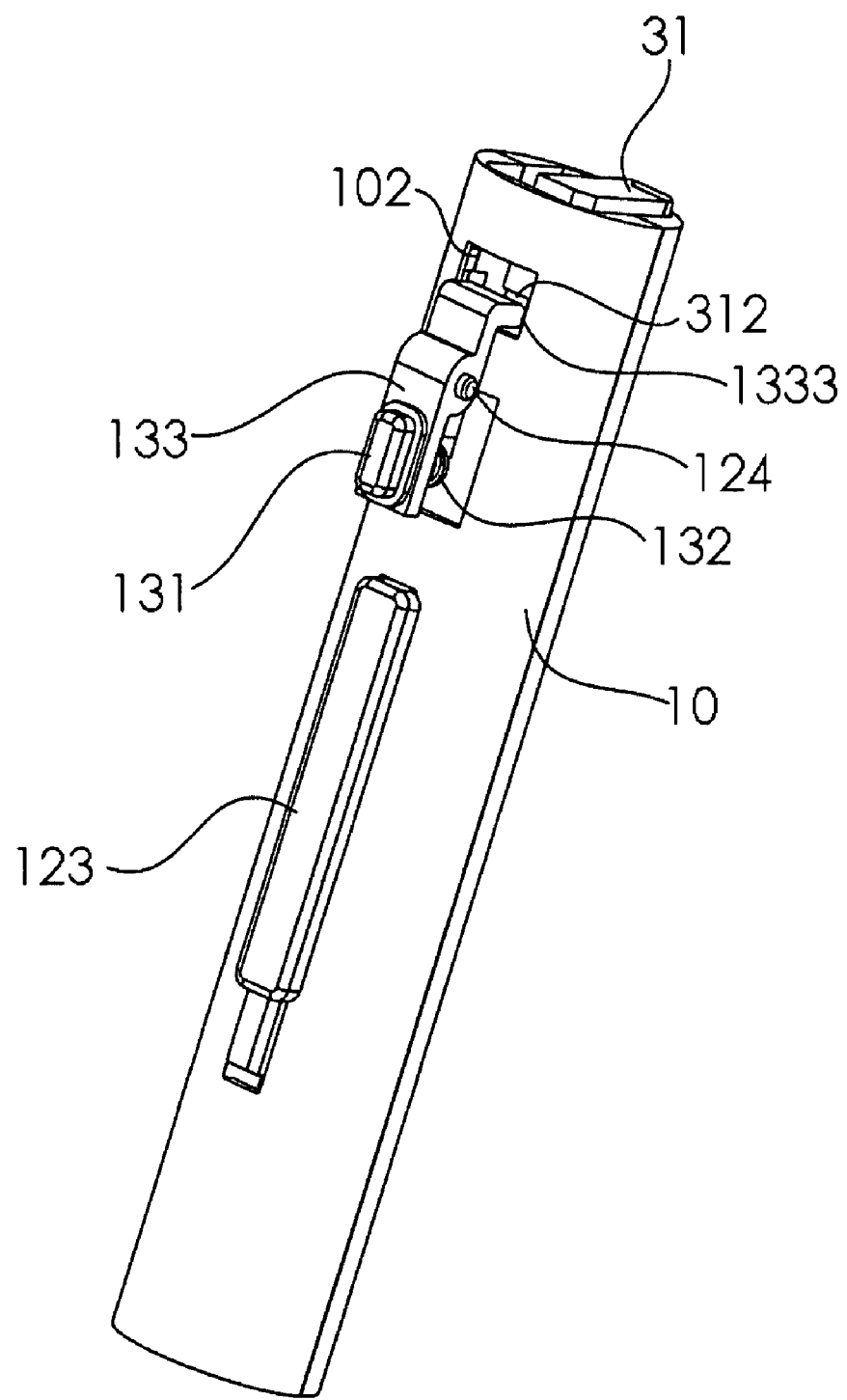
FIG. 10 is a perspective view of a connection plug and a pressing component of the second preferred embodiment in accordance with the present invention.

With reference to FIGS. 8 to 10, a third slot (312) is formed on a side surface of the connection plug (31). An opening (102) is formed through an inner surface of the housing (10) corresponding to the third slot (312) so that an end portion (1333) of an actuation plate (133) may penetrate through the opening (102) to urge against the third slot (312).

Besides the aforementioned differences, the second embodiment is identical to the first embodiment. Therefore, when the connection plug (31) is received in the chamber (11) of the housing (10) and a force is exerted on the pressing part (131), the elastic member (132) is compressed. Preferably, a stationary point (134) is formed inside the actuation plate (133). Hence, when the pressing part (131) is pressed, the elastic member (132) is compressed and an end portion (1333) of the actuation plate (133) is disengaged with the actuation plate (133). Meanwhile, an elastic element (15) between a support seat (213) and a stopper (14) releases a pre-pressure to eject a connection plug (31) out of the chamber (11) so that the connection plug (31) is electrically connect with an electronic device (not shown) having a data transmission interface to perform data transmission. Besides, the housing (10) may take different form or become accessory of other merchandises, such as pens, business card holders, key chains, pencil cases, lighting devices or the like.

Figure 11:
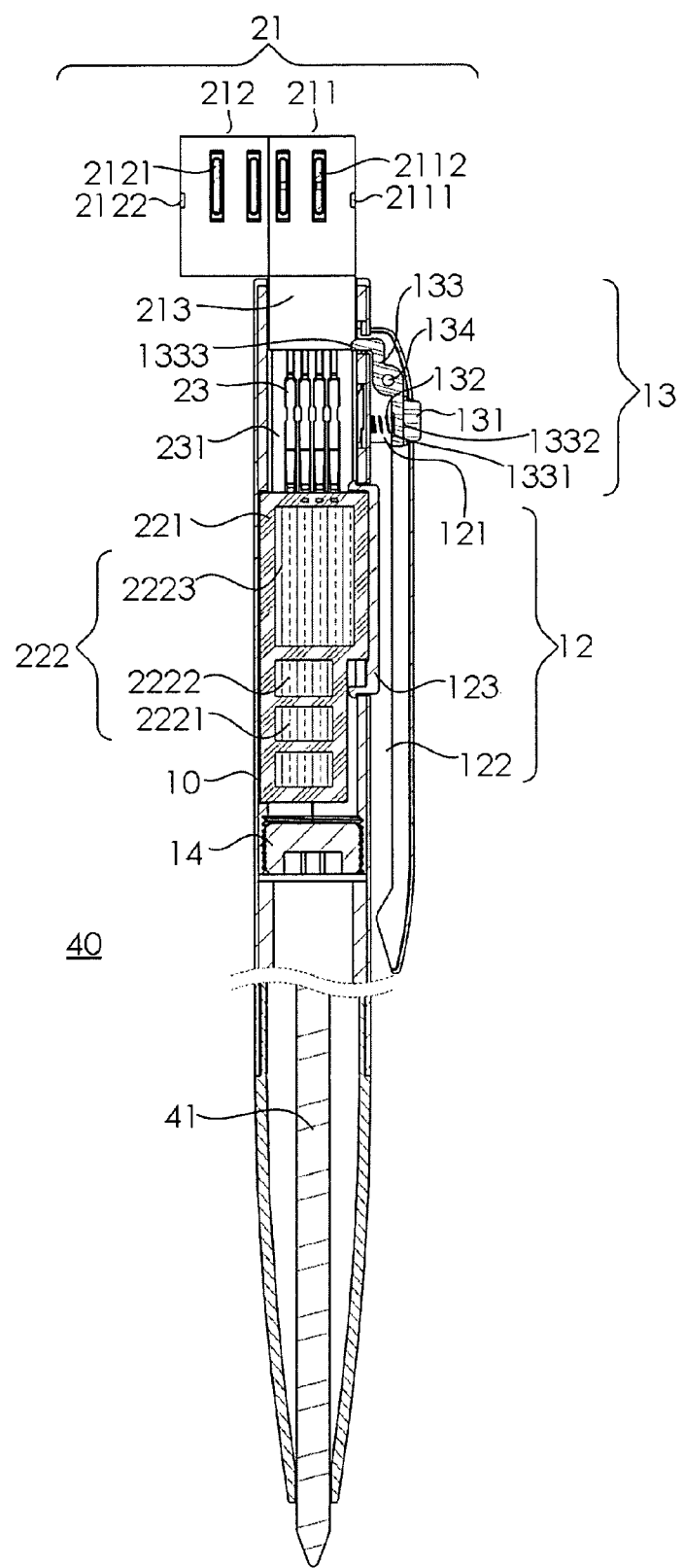
FIG. 11 is a cross-sectional view of a third preferred embodiment of a structure having memory module in accordance with the present invention.

With reference to FIG. 11, a third embodiment of a structure having an USB memory module in accordance with the present invention is illustrated. Similar parts of the first embodiment illustrated in FIGS. 2 to 6 are marked with same reference numerals in FIG. 10 and are not repeated. The third embodiment differs from the first embodiment only in that the housing (10) may be a pen-shaped housing (40), a refill (41) is mounted in a lower end of the pen-shaped housing (40), the pen-shaped housing (40) maybe be a combination of multiple portions detachably connected, the attaching element (12) may be a pen clip, and the maximal outer diameter of the pen-shaped housing is equal to or less than 12 mm. Except the foregoing distinction, the third embodiment is the same as the first embodiment.

Figure 12:
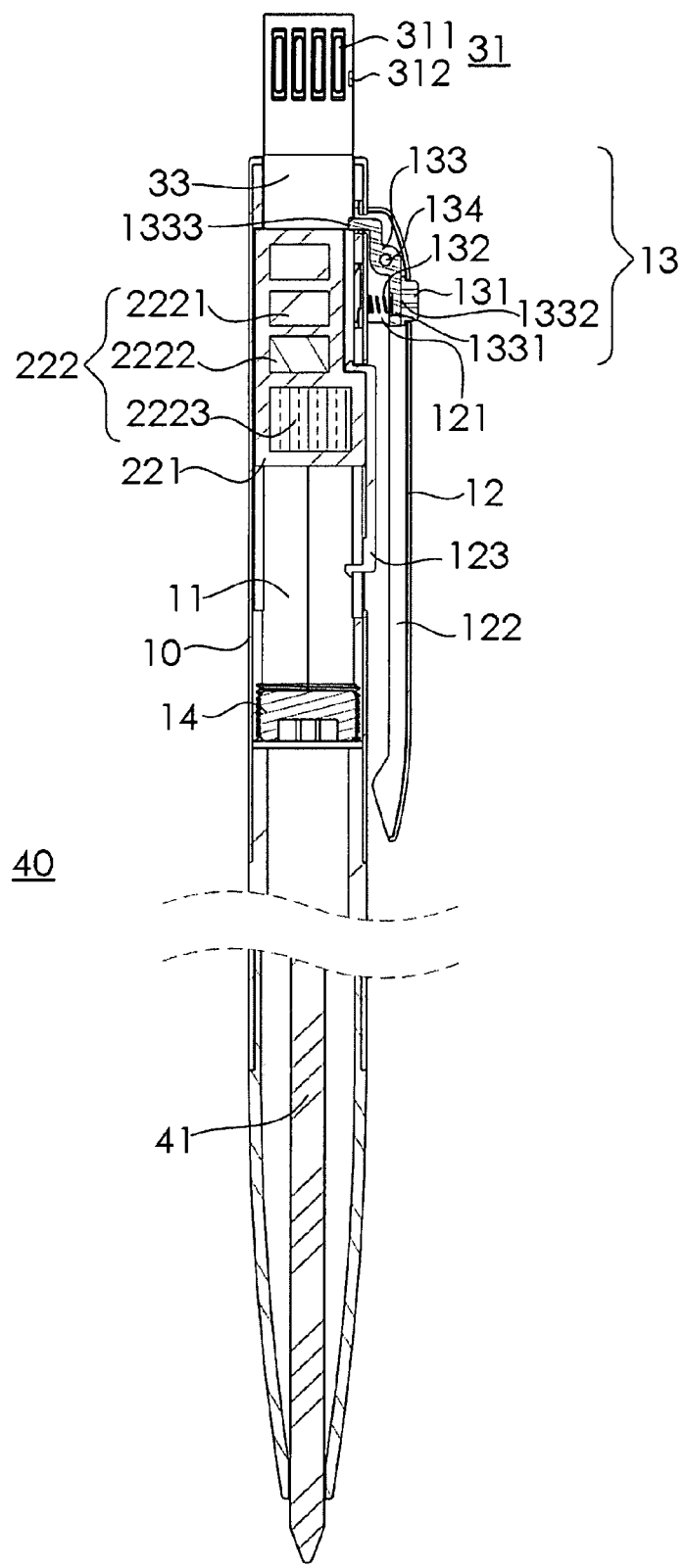
FIG. 12 is a cross-sectional view of a fourth preferred embodiment of a structure having memory module in accordance with the present invention.

With reference to FIG. 12, a fourth embodiment of a structure having an USB memory module in accordance with the present invention is illustrated. Similar parts of the second embodiment of the structure having an USB memory module illustrated in FIGS. 7 to 10 are marked with same reference numerals in FIG. 12 and are not repeated. The fourth embodiment differs from the second embodiment only in that the housing (10) may be a pen-shaped housing (40), a refill (41) is mounted in a lower end of the pen-shaped housing (40), the pen-shaped housing (40) maybe be a combination of multiple portions detachably connected, the attaching element (12) may be a pen clip. Except the foregoing distinction, the fourth embodiment is the same as the second embodiment.

With reference to FIGS. 13 to 16, a fifth embodiment of a structure having an USB memory module in accordance with the present invention is illustrated. Similar parts of the first embodiment of the structure having an USB memory module illustrated in FIGS. 2 to 6 are marked with same reference numerals in FIGS. 13 to 16.

Figure 13:
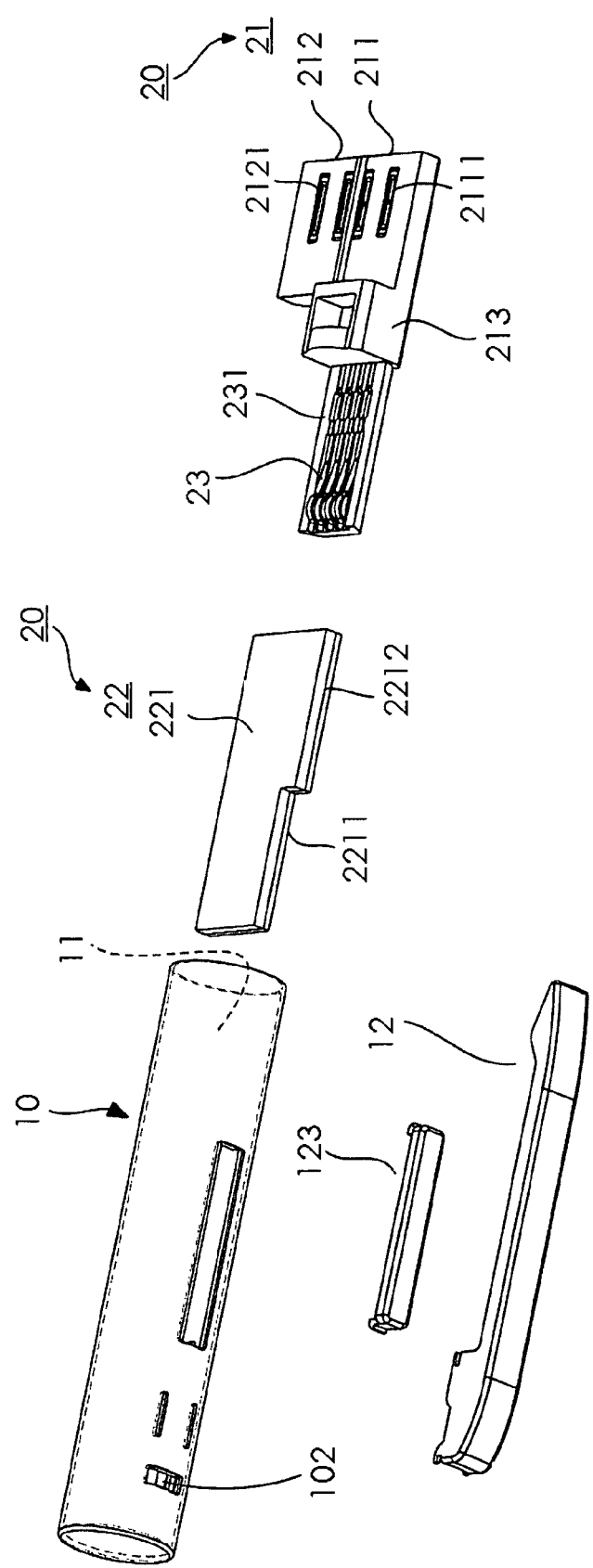
FIG. 13 is an exploded view of a fifth preferred embodiment of a structure having memory module in accordance with the present invention.
Figure 14:
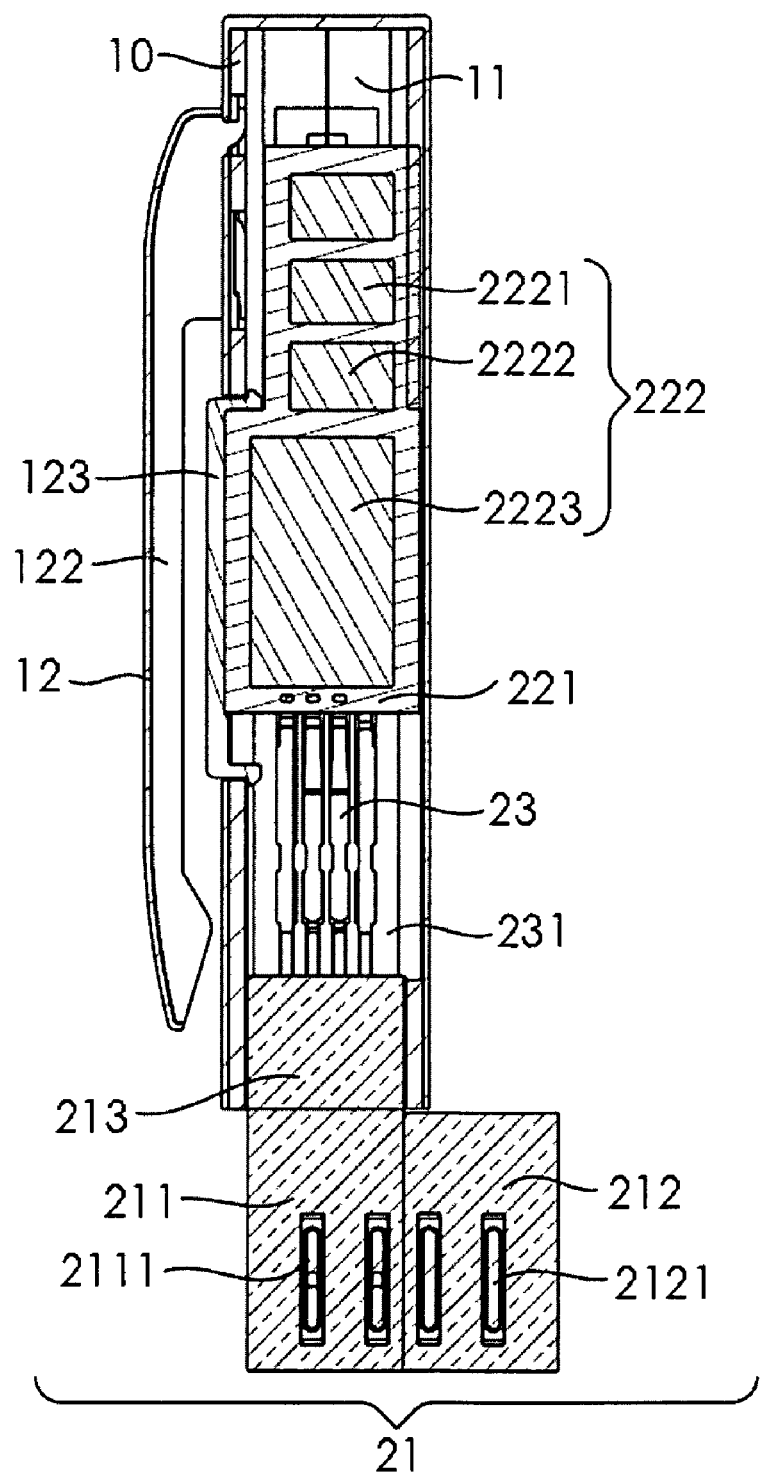
FIG. 14 is a cross-sectional view of the fifth preferred embodiment of the structure having memory module in accordance with the present invention.
Figure 15:
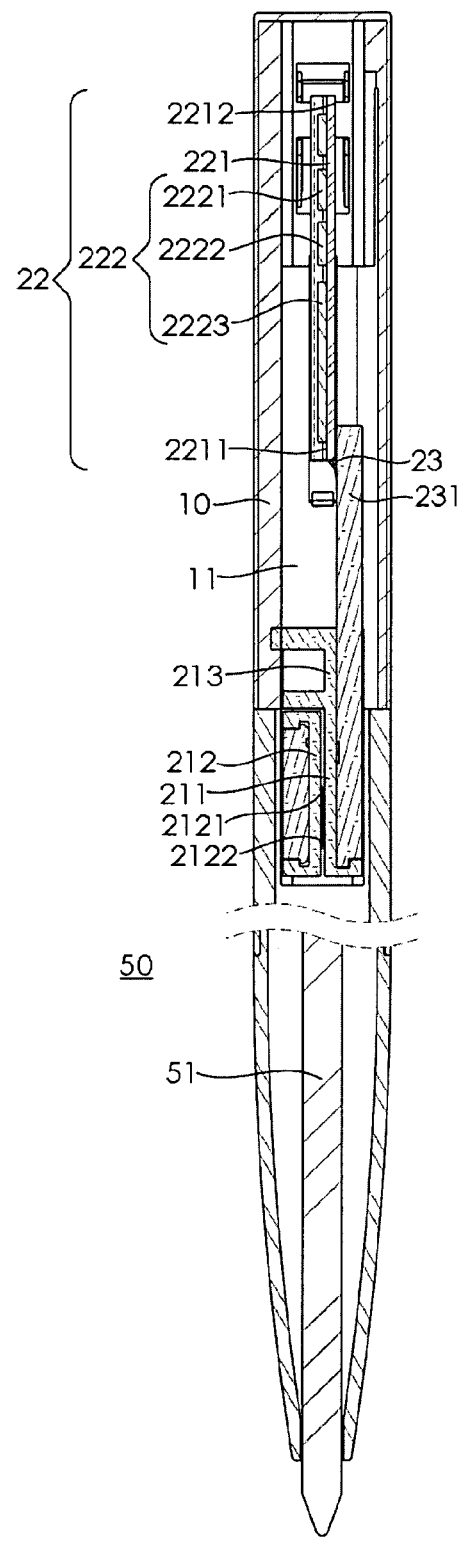
FIG. 15 is another cross-sectional view of the fifth preferred embodiment of the structure having memory module in accordance with the present invention.

With reference to FIG. 13, the fifth embodiment of the structure having an USB memory module has a housing (10) and a data storage device (20). The housing (10) is hollow and has a chamber (11) therein. The data storage device (20) has a foldable connection plug (21) and a memory module (22). The foldable connection plug (21) has a foldable part (211), a second foldable part (212) and a support seat (213). With reference to FIG. 15, the support seat (213) is received in the chamber (11) while the first foldable part (211) and the second foldable part (212) are exposed beyond the housing (10). Preferably, one end of a tubular element (50) is capped on the housing (10) to receive the first foldable part (211) and the second foldable part (212) therein. Preferably, a refill (51) is mounted to the other end of the tubular element (50) to provide a complete pen structure. With reference to FIG. 14, a rear end of the first foldable part (211) is mounted on a front end of the support seat (213). Besides, the first foldable part (211) and the second foldable part (212) respectively have a plurality of metal contacts (2111)(2121). Preferably, these metal contacts (2111, 2121) may be compatible with at least one digital data transmission specification of the USB, Mini USB, Micro USB and e-SATA transmission interfaces. Moreover, the memory module (22) may be partially received in the chamber (11) of the housing (10) and partially exposed beyond the housing (10). Preferably, a groove (122) is formed in a rear end of the attaching element (12) to cover the memory module (22) exposed beyond the housing (10). Furthermore, a lid (123) is mounted on an outer periphery (101) of the housing (10) so that the lid (123) fully covers the memory module (22) exposed beyond the housing (10).

Figure 16:
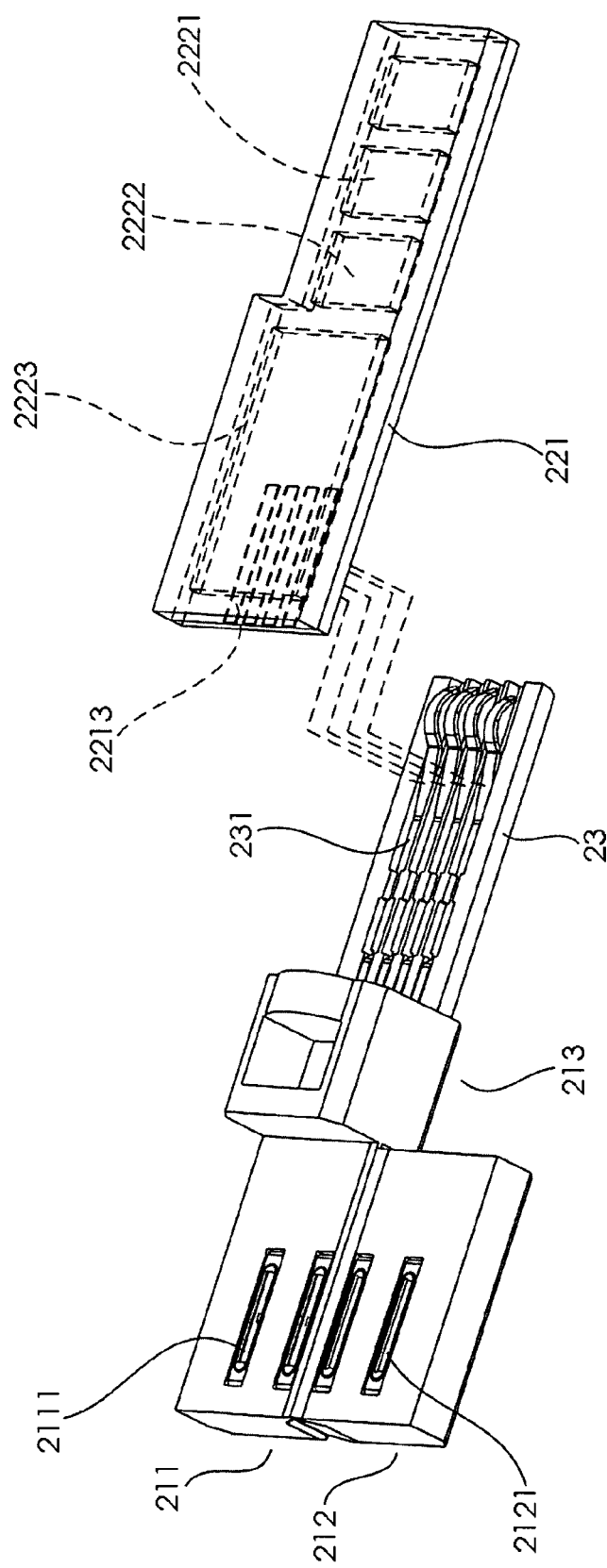
FIG. 16 is a perspective view of metal contacts of a first foldable part and a second foldable part of the fifth preferred embodiment electrically connected with metal contacts of a memory module through a plurality of conductors in accordance with the present invention.

With reference to FIG. 16, the memory module (22) has a substrate (221) and at least one electronic component (222). The substrate (221) has an inside surface (2211) and an outside surface (2212). The at least one electronic component (222) is mounted on the inside surface (2211). A plurality of metal contacts (2213) are mounted on the outside surface (2212). Each of the at least one electronic component (222) has at least one control unit (2221), at least one passive element (2222) and at least one memory chip (2223). Preferably, the substrate (221) may be a high-density multilayer printed circuit board having conducting vias and circuits (not shown) formed therein and electrically connected (not shown) with the at least one electronic component (222) and the metal contacts (2213) on the substrate (221).

With further reference to FIGS. 14 to 16, the metal contacts (2111, 2121) of the first foldable part (211) and the second foldable part (212) are electrically connected with the plurality of metal contacts (2213) of the substrate (221) through a plurality of conductors (23). Preferably, those conductors (23) may be mounted on a load board (231). The load board (231) may be securely mounted on a lower surface of the first foldable part (211) and the support seat (213). The conductors (23) may be at least one of wire, metal bump and metal sheet or any combination thereof. Certainly, electrical connection between the foldable connection plug (21) and the substrate (221) is not limited to the aforementioned means. Besides, the first foldable part (211) and the support seat (213) may be integrally or detachably formed, and is integrally formed in the fifth preferred embodiment. When the second foldable part (212) and the first foldable part (211) are coplanar and electrically connected with an electronic device (not shown) having data transmission interface, data transmission can be performed.

In sum, the present invention discloses a structure having an USB memory module redesigning the combined structure of the memory module to additionally mount the data storage device without increasing the outer diameter of the product. Therefore, the product maintains existing function and size and also has data storage function to make the present invention multi-functional.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A structure having an USB memory module, comprising:
   a housing being hollow and having a chamber therein; and a data storage device having
  a foldable connection plug having
    a support seat having a front end;
    a first foldable part having a rear end mounted on the front end of the support seat and a plurality of first metal contacts; and
    a second foldable part having a plurality of second metal contacts; and
  a memory module having
    a substrate having an inside surface and an outside surface; and
    at least one electronic component mounted on the inside surface;
  wherein a plurality of third metal contacts are mounted on the outside surface, the substrate is electrically connected with the at least one electronic component and the plurality of third metal contacts, the plurality of first metal contacts of the first foldable part and the plurality of second metal contacts of the second foldable part are electrically connected with the plurality of third metal contacts through a plurality of conductors, and the memory module is partially received in the chamber of the housing and partially exposed beyond the housing.

2. The structure having an USB memory module as claimed in claim 1, wherein the foldable connection plug is received in the chamber of the housing.

3. The structure having an USB memory module as claimed in claim 1, wherein the first foldable part and the second foldable part of the foldable connection plug are exposed beyond the housing, a tubular element is combined with the housing to receive the first foldable part and the second foldable part therein.

4. The structure having an USB memory module as claimed in claim 1, wherein the housing has an outer periphery, and an attaching element is mounted on the outer periphery.

5. The structure having an USB memory module as claimed in claim 4, wherein the attaching element has an accommodation portion for mounting a pressing element, and the pressing element comprises:
  an actuation plate;
  a pressing part is mounted on an outer surface at the end of the actuation plate; and
  an elastic member is mounted on an inner surface at one end of the actuation plate; and
  the pressing part and the elastic member are correspondingly mounted.

6. The structure having an USB memory module as claimed in claim 5, wherein the first foldable part has a first slot on a side surface thereof, and the second foldable part has a second slot on a side surface thereof, the first slot and the second slot are adjacently mounted, an opening is formed through an inner surface of the housing corresponding to the first slot and the second slot so that an end portion of the actuation plate penetrates through the opening to urge against the first slot and the second slot.

7. The structure having an USB memory module as claimed in claim 1, wherein the first metal contacts of the first foldable part and the second metal contacts of the second foldable part are compatible with at least one digital data transmission specification of the USB, Mini USB, Micro USB and e-SATA transmission interfaces.

8. A structure having an USB memory module, comprising:
  a housing being hollow and having a chamber formed therein;
  a data storage device having
    a connection plug received in the chamber of the housing and having
      a support seat having
        a front end mounted to a rear end of the connection plug, and
        a rear end; and
      a plurality of metal contacts;
    a memory module having
      a front end mounted to the rear end of the support seat;
      a substrate having an inside surface and an outside surface; and
      at least one electronic component mounted on the inside surface;
    wherein the substrate is electrically connected with the at least one electronic component and the plurality of metal contacts of the connection plug, and the memory module is partially received in the chamber of the housing and partially exposed beyond the housing.

9. The structure having an USB memory module as claimed in claim 8, wherein the housing has an outer periphery, an attaching element is mounted on the outer periphery, the attaching element has an accommodation portion for mounting a pressing element, the pressing element has
  an actuation plate;
  an elastic member mounted on an inner surface at one end of the actuation plate; and
  a pressing part mounted on an outer surface at the end of the actuation plate to correspond to the elastic member.

10. The structure having an USB memory module as claimed in claim 9, wherein the memory module is partially exposed beyond the housing through a through slot of the housing, and the through slot extends toward two ends of the housing, a groove is formed on a rear side of the accommodation portion to correspond to the through slot and cover the memory module exposed beyond the housing.

11. The structure having an USB memory module as claimed in claim 9, wherein the connection plug has a third slot formed on a side surface thereof, an opening is formed through an inner surface of the housing corresponding to the third slot so that an end portion of the actuation plate penetrates through the opening to urge against the third slot.

12. The structure having an USB memory module as claimed in claim 8, wherein the plurality of the metal contacts of the connection plug are compatible with at least one digital data transmission specification of USB, Mini USB, Micro USB and e-SATA transmission interfaces.

13. The structure having an USB memory module as claimed in claim 1, wherein the housing is a pen-shaped housing, and a refill is mounted in a lower end of the pen-shaped housing.

14. The structure having an USB memory module as claimed in claim 8, wherein the housing is a pen-shaped housing, and a refill is mounted in a lower end of the pen-shaped housing.

15. The structure having an USB memory module as claimed in claim 13, wherein the pen-shaped housing is a combination of multiple portions detachably connected.

16. The structure having an USB memory module as claimed in claim 14, wherein the pen-shaped housing is a combination of multiple portions detachably connected.

17. The structure having an USB memory module as claimed in claim 13, wherein the pen-shaped housing has a maximal outer diameter no greater than 12 mm.

* * * * *